(12) United States Patent
Basker et al.

(10) Patent No.: US 9,711,645 B2
(45) Date of Patent: Jul. 18, 2017

(54) METHOD AND STRUCTURE FOR MULTIGATE FINFET DEVICE EPI-EXTENSION JUNCTION CONTROL BY HYDROGEN TREATMENT

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 104 days.

(21) Appl. No.: 14/141,051

(22) Filed: Dec. 26, 2013

(65) Prior Publication Data
US 2015/0187577 A1 Jul. 2, 2015

(51) Int. Cl.
| H01L 21/336 | (2006.01) |
| H01L 29/78 | (2006.01) |
| H01L 29/66 | (2006.01) |
| H01L 21/02 | (2006.01) |

(52) U.S. Cl.
CPC ...... *H01L 29/785* (2013.01); *H01L 21/02694* (2013.01); *H01L 29/66742* (2013.01); *H01L 29/66795* (2013.01); *H01L 29/66818* (2013.01)

(58) Field of Classification Search
CPC .................. H01L 29/66795; H01L 29/66818

USPC ........... 257/E21.442, E21.431; 438/197, 300
See application file for complete search history.

(56) References Cited

U.S. PATENT DOCUMENTS

| 6,764,884 | B1 | 7/2004 | Yu et al. |
| 6,992,354 | B2 | 1/2006 | Nowak et al. |
| 7,029,958 | B2 | 4/2006 | Tabery et al. |
| 7,550,333 | B2 | 6/2009 | Shah et al. |
| 7,858,481 | B2 | 12/2010 | Brask et al. |
| 8,034,689 | B2 | 10/2011 | Lenoble et al. |
| 8,268,729 | B2 | 9/2012 | Cheng et al. |
| 2008/0014688 | A1* | 1/2008 | Thean et al. .................. 438/197 |
| 2011/0068407 | A1* | 3/2011 | Yeh .................... H01L 21/82380 257/369 |
| 2011/0084336 | A1 | 4/2011 | Luning et al. |
| 2011/0101455 | A1 | 5/2011 | Basker et al. |
| 2011/0147828 | A1* | 6/2011 | Murthy ............. H01L 21/02057 257/327 |
| 2013/0078818 | A1 | 3/2013 | Lin et al. |
| 2013/0154029 | A1 | 6/2013 | Cai et al. |

(Continued)

OTHER PUBLICATIONS

PCT International Search Report and Written Opinion; International Application No. PCT/US 14/60000; International Filing Date: Oct. 10, 2014, Date of Mailing: Jan. 9, 2015, pp. 1-12.

(Continued)

*Primary Examiner* — Robert Huber
(74) *Attorney, Agent, or Firm* — Cantor Colburn LLP (57) ABSTRACT

Embodiments are directed to forming a structure comprising at least one fin, a gate, and a spacer, applying an annealing process to the structure to create a gap between the at least one fin and the spacer, and growing an epitaxial semiconductor layer in the gap between the spacer and the at least one fin.

8 Claims, 10 Drawing Sheets

100

(56) References Cited

U.S. PATENT DOCUMENTS

2013/0200468 A1    8/2013  Cai et al.

OTHER PUBLICATIONS

M. Lee et al., "Thermal annealing in hydrogen for 3-D profile transformation on silicon-on-insulator and sidewall roughness reduction," Journal of Microelectromechanical Systems, vol. 15, No. 2, 2006, pp. 338-343.

T. Tezuka et al., "{110} -facets formation by hydrogen thermal etching on sidewalls of Si and strained-Si fin structures," Applied Physics Letters, vol. 92, 2008, 191903, 3 pages.

W. Xiong et al., "Improvement of FinFET electrical characteristics by hydrogen annealing," IEEE Electron Device Letters, vol. 25, No. 8, 2004, pp. 541-543.

\* cited by examiner

METHOD AND STRUCTURE FOR MULTGATE FINFET DEVICE EPI-EXTENSION JUNCTION CONTROL BY HYDROGEN TREATMENT

FIELD OF INVENTION

The present invention relates generally to computer technology, and more specifically, to the fabrication of a semiconductor device, such as a fin field effect transistor (Fin-FET).

DESCRIPTION OF RELATED ART

Dopant diffusion may be used in connection with FinFET junction engineering. For example, dopant diffusion is employed for extension overlap formation. Issues may be encountered in connection with spacer doping and resultant junction gradients. It may be difficult to provide or obtain doping in a region between one or more fins and a gate (potentially in connection with a spacer or insulator). Conventionally, implants are used to achieve doping. However, implants can cause damage to the fins, which leads to an undesirable increase in terms of resistance.

BRIEF SUMMARY

Embodiments are directed to a method for fabricating a semiconductor device comprising: forming a structure comprising at least one fin, a gate, and a spacer, applying an annealing process to the structure to create a gap between the at least one fin and the spacer, and growing an epitaxial semiconductor layer in the gap between the spacer and the at least one fin.

Embodiments are directed to a semiconductor device comprising: a fin, a gate formed on the fin, a spacer formed on the gate and the fin, and an epitaxial layer formed in a gap between the fin and the spacer as a result of an application of an annealing process to the device.

Embodiments are directed to a fin field effect transistor (FinFET) comprising: a plurality of silicon fins, a gate formed over the fins, a spacer formed over the gate and at least a portion of the fins, and an epitaxy layer formed in a gap between each of the fins and the spacer, wherein the gap is formed based on an application of an annealing process to the transistor.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

It is noted that various connections are set forth between elements in the following description and in the drawings (the contents of which are included herein by way of reference). It is noted that these connections in general and, unless specified otherwise, may be direct or indirect and that this specification is not intended to be limiting in this respect. In this regard, a coupling of entities may refer to either a direct or an indirect connection.

Figure 1A:
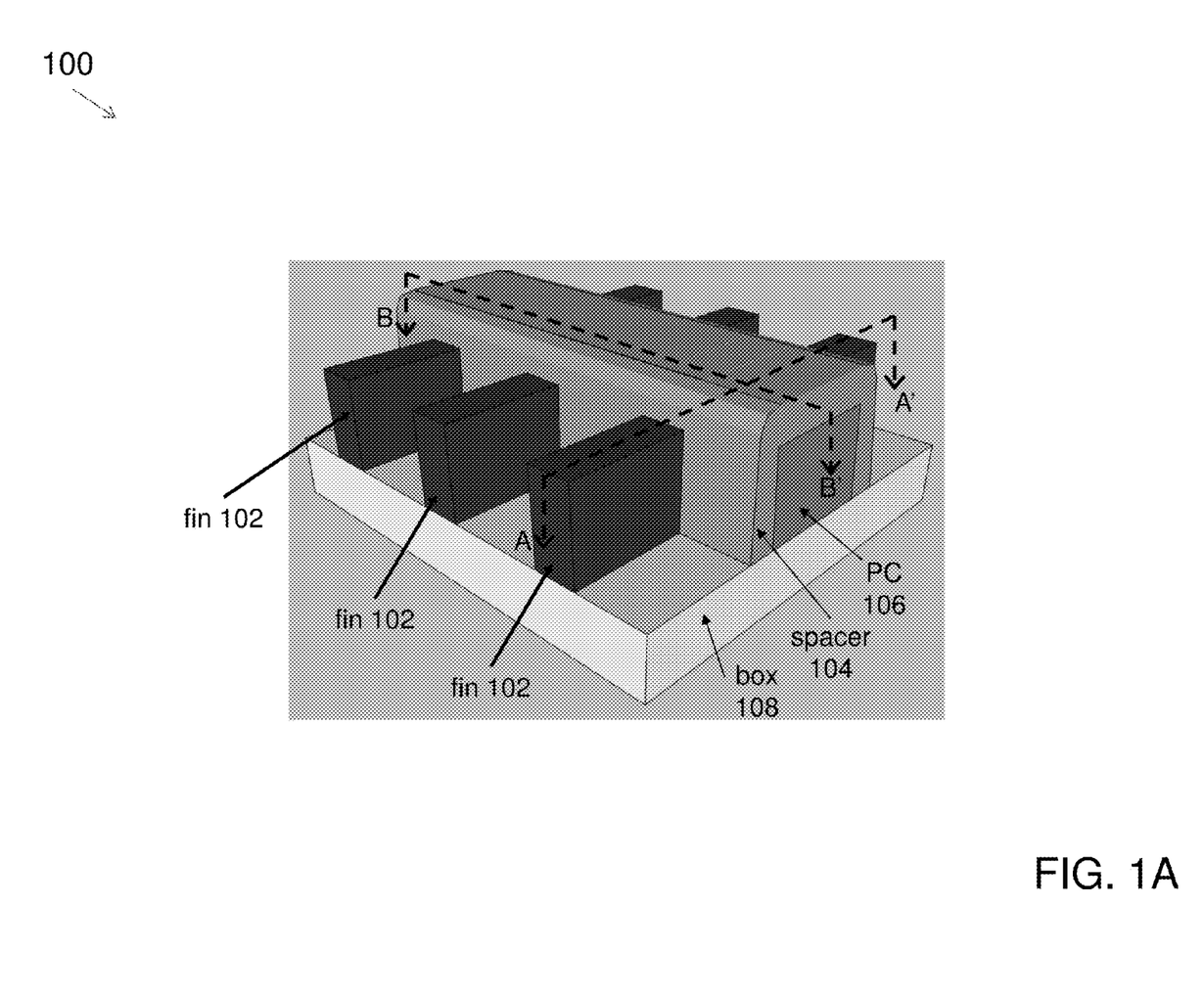
FIG. 1A is an exemplary diagram of a structure in accordance with one or more embodiments.
Figure 1B:
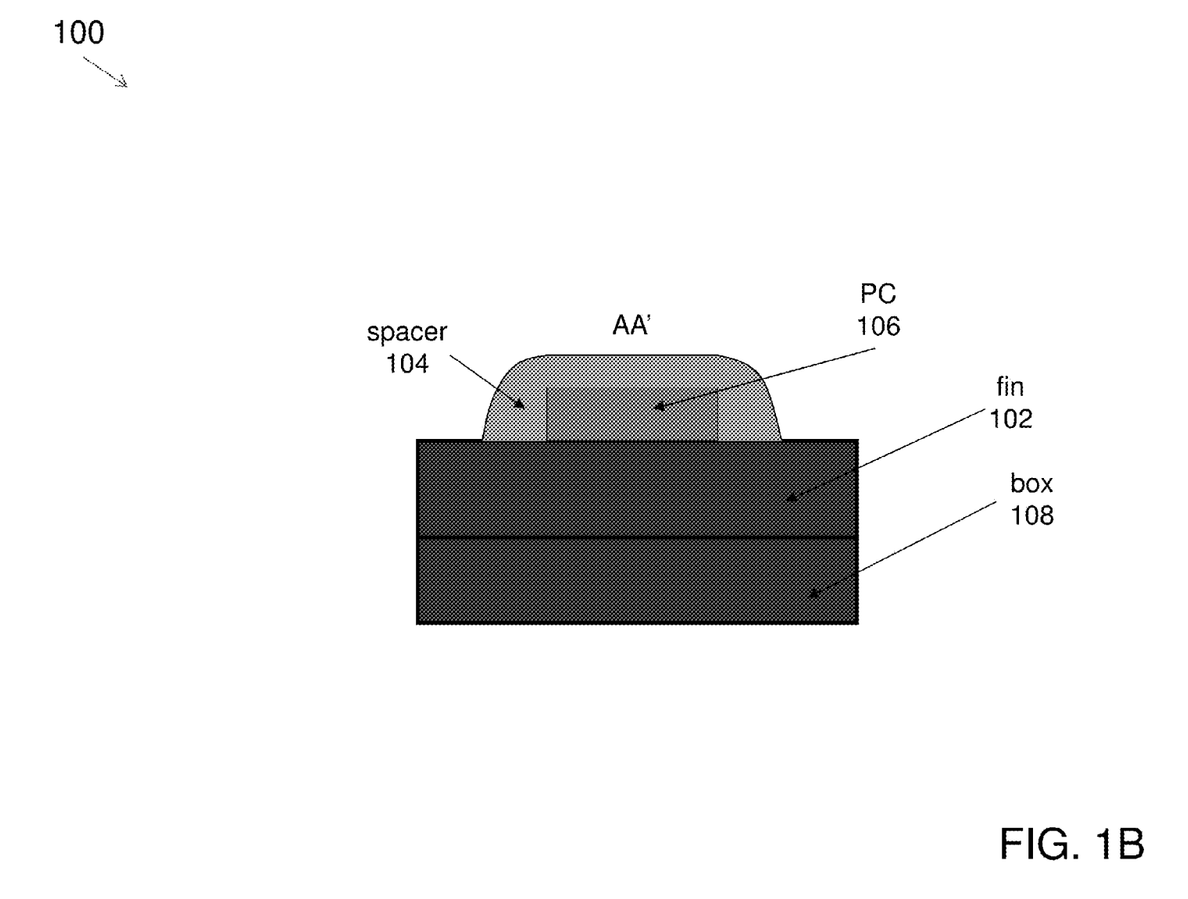
FIG. 1B shows a front perspective view of the structure of FIG. 1A along the line A-A' shown in FIG. 1A.
Figure 1C:
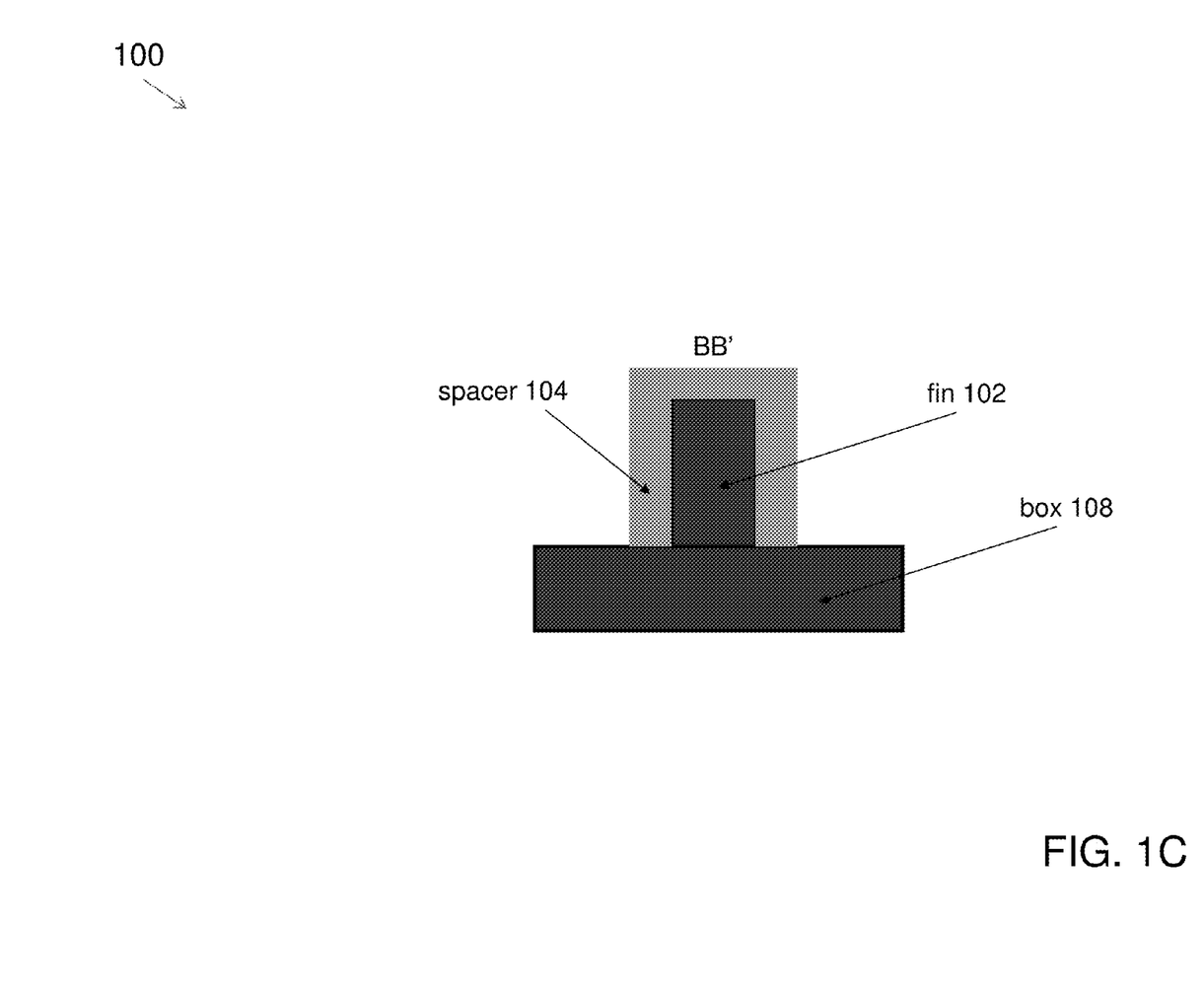
FIG. 1C shows a side perspective view of the structure of FIG. 1A along the line B-B' shown in FIG. 1A.

Turning to FIGS. 1A-1C, an exemplary embodiment of a structure 100 is shown. The structure 100 is shown as including one or more silicon (Si) fins 102 with a spacer 104 and a PC 106. The fins 102 may be substantially parallel to one another as shown in FIG. 1A. The PC 106 may correspond to the gate of the structure 100. The spacer 104 may protect the gate/PC 106 by providing insulation between the gate/PC 106 and a source-drain region of the structure 100.

The fins 102, spacer 104, and PC 106 may be formed on, a buried oxide (BOX) 108. The BOX layer 108 may be part of a semiconductor-on-insulator (SOI) substrate, e.g., a silicon-oxide-silicon stack-up.

Figure 2A:
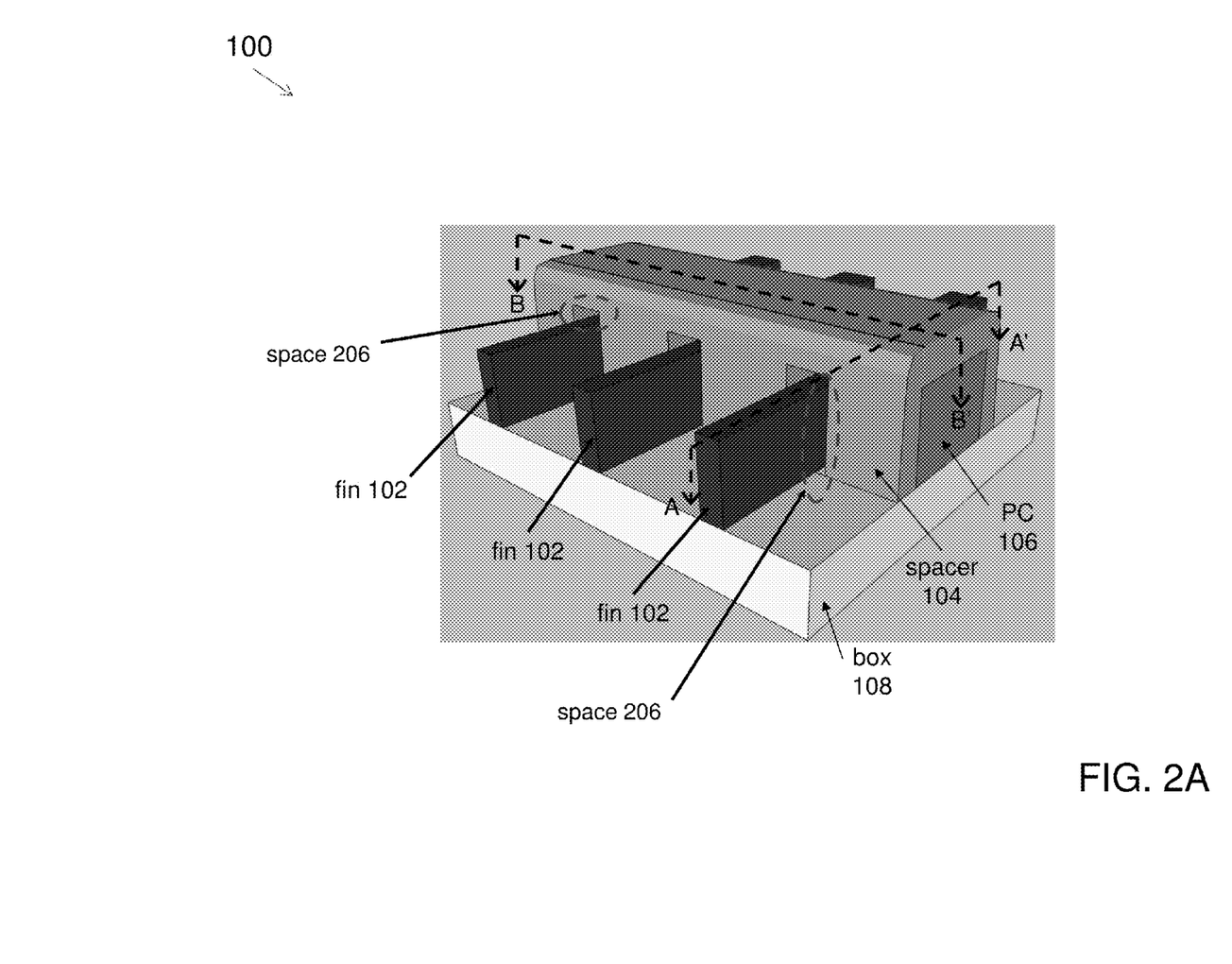
FIG. 2A is an exemplary diagram of the structure of FIG. 1A following annealing in accordance with one or more embodiments.
Figure 2B:
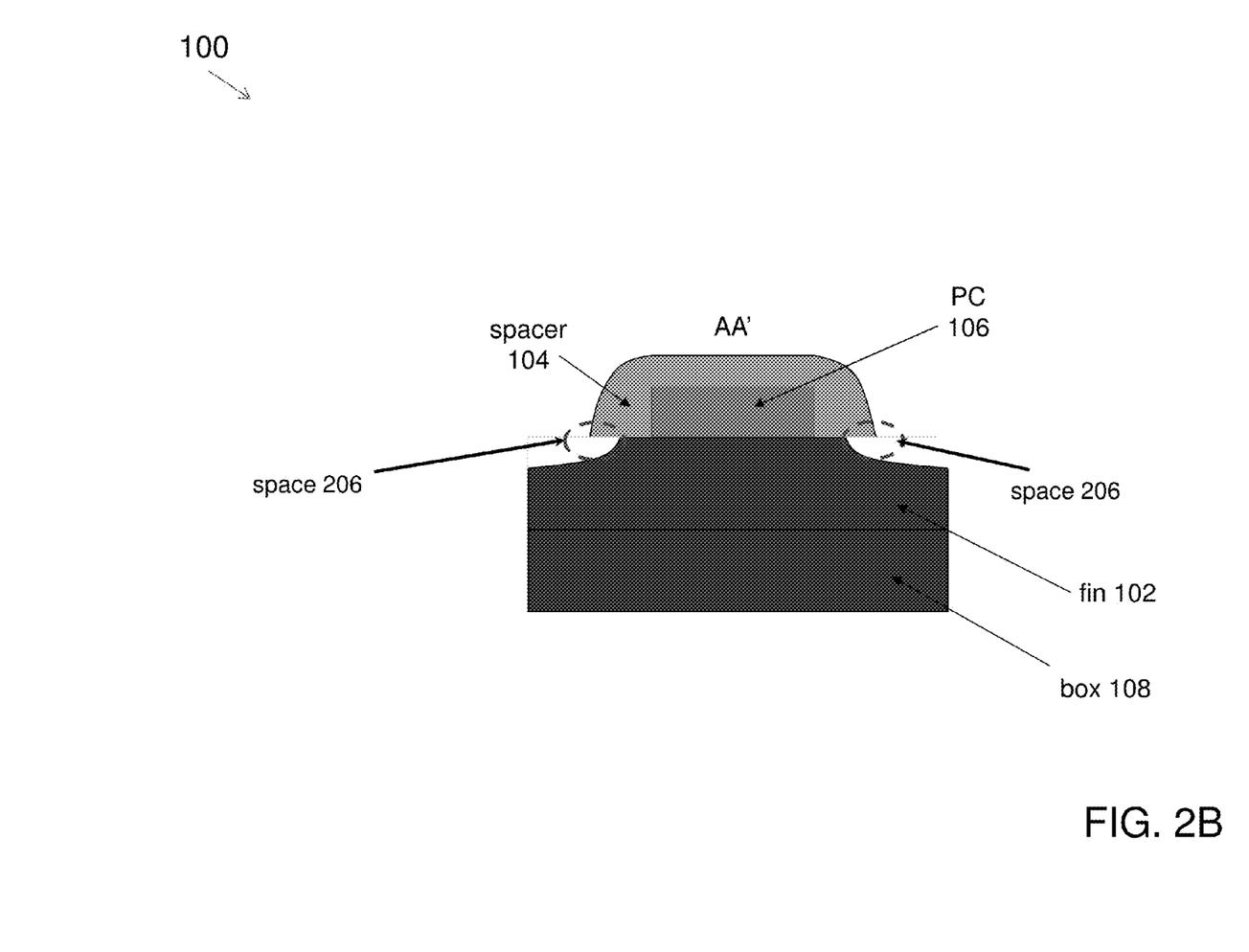
FIG. 2B shows a front perspective view of the structure of FIG. 2A along the line A-A' shown in FIG. 2A.
Figure 2C:
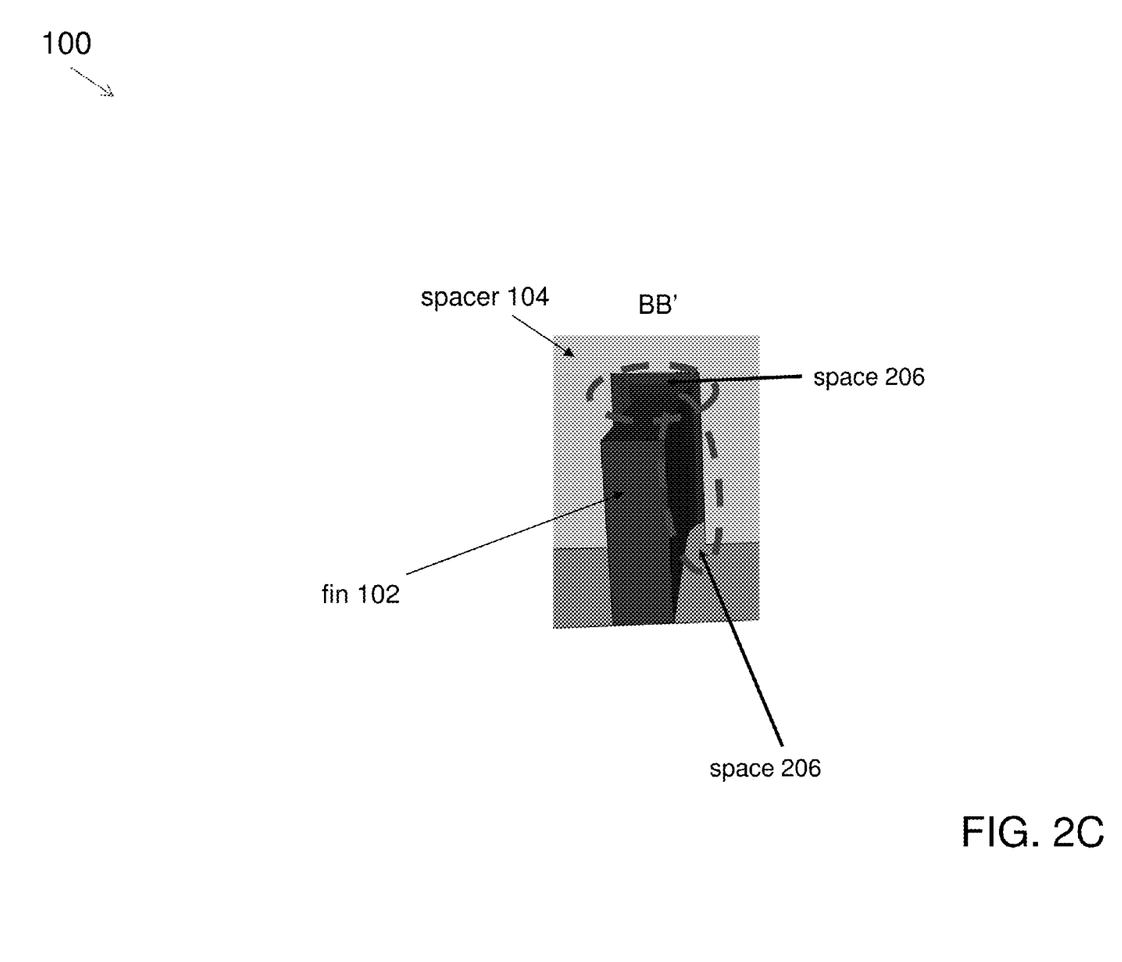
FIG. 2C shows a side perspective view of the structure of FIG. 2A along the line B-B' shown in FIG. 2A.

Turning to FIGS. 2A-2C, the structure 100 is shown following the application of an annealing process. For example, hydrogen ($H_2$) annealing may be applied at approximately: seven-hundred fifty degrees Celsius and ten torr for five minutes. Based on the annealing, the fins 102 may undergo shrinkage, leaving a gap or space (denoted by, or in proximity to, the dashed circle 206) between the fins 102 and the spacer 104 as shown in FIGS. 2A-2C. The annealing process may leave the fins 102 generally in place with respect to the structure 100 (e.g., the fins might not be disturbed) and may serve as a controlled process for creating generally uniform gaps/spaces 206. The annealing process may be contrasted with conventional processes, wherein the conventional processes: (1) tend to be manual in nature, (2) upset or move the fins, and (3) tend to lack uniformity. The annealing process described herein may be performed to facilitate a growth of an epitaxy (epi) layer as described below.

The gap/space 206 may be created to allow for growth of an epi layer on the exposed silicon surfaces of the fins 102. For n-type devices, phosphorous-doped polysilicon may be used. For p-type devices, boron may be used. Other types of materials or dopants may be used in some embodiments.

Figure 3A:
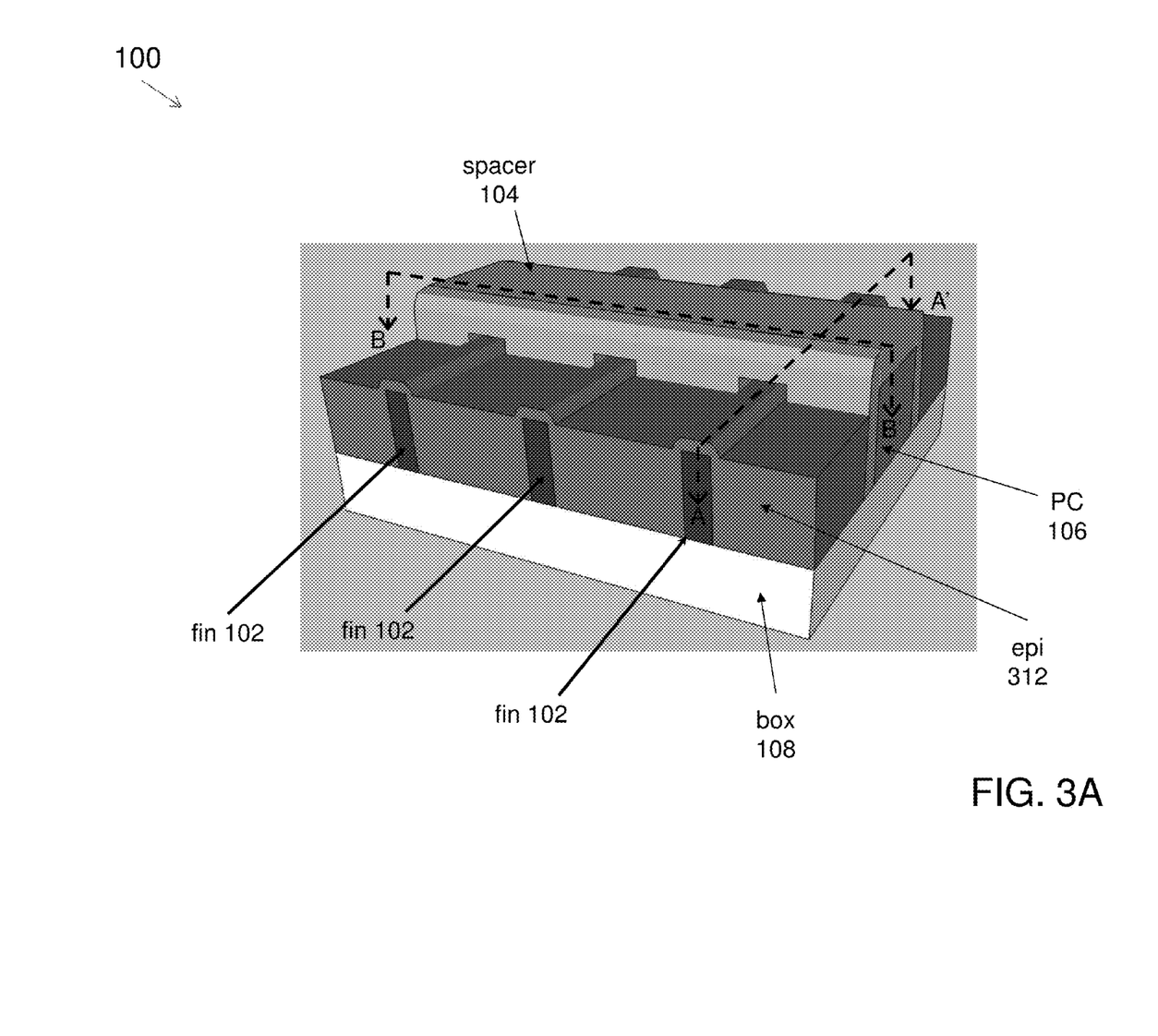
FIG. 3A is an exemplary diagram of the structure of FIG. 2A following growth/insertion of epitaxy (epi) in accordance with one or more embodiments.
Figure 3B:
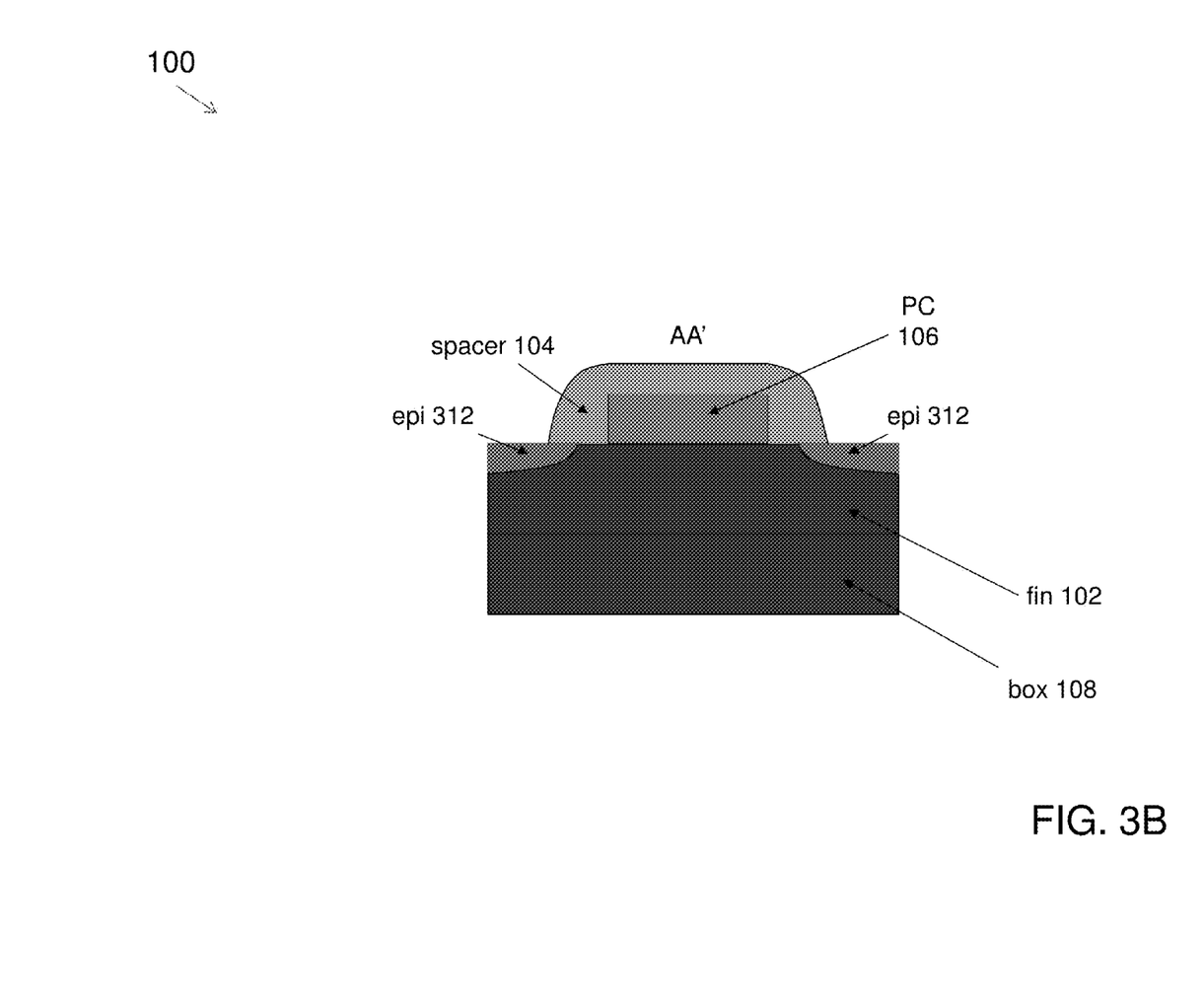
FIG. 3B shows a front perspective view of the structure of FIG. 3A along the line A-A' shown in FIG. 3A.
Figure 3C:
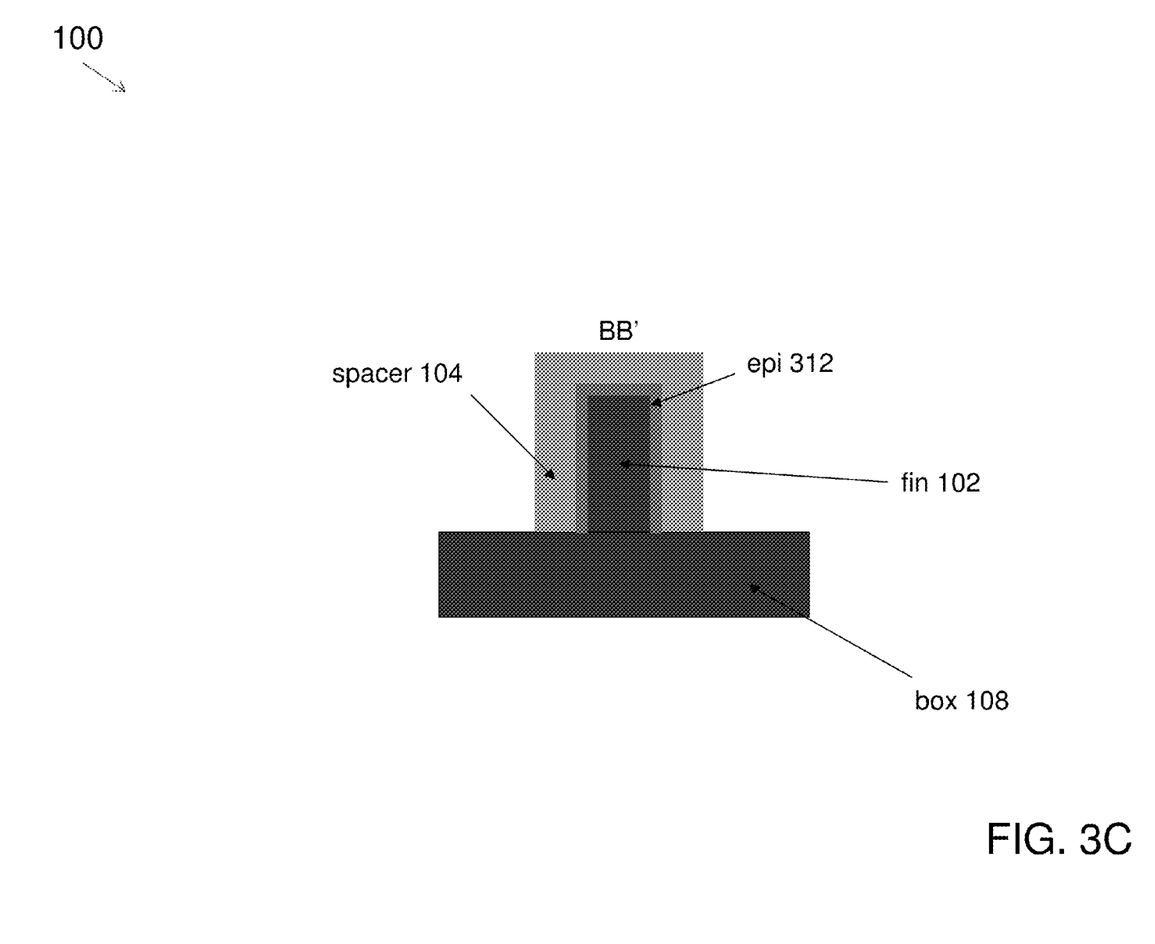
FIG. 3C shows a side perspective view of the structure of FIG. 3A along the line B-B' shown in FIG. 3A.

Turning to FIGS. 3A-3C, the structure 100 is shown following the growth of epi 312 in the gap/space 206 between the spacer 104 and the fins 102. The epi 312 may ensure proper extension overlap and a suppressed extension junction gradient. The sharper junction (less junction gradient) contributes to improved gate short channel control, and thus, less leakage current when the transistor is in an off state. Typically, the junction can be achieved with a reduced thermal budget (less dopant diffusion). But, a reduction in terms of thermal budget/lower dopant diffusion may lead to insufficient dopant activation, and thus, an increase of series resistance. Embodiments described herein can achieve a sharp extension junction without compromising the dopant activation, since a reduction in the distance that the dopants need to diffuse is provided.

Figure 4:
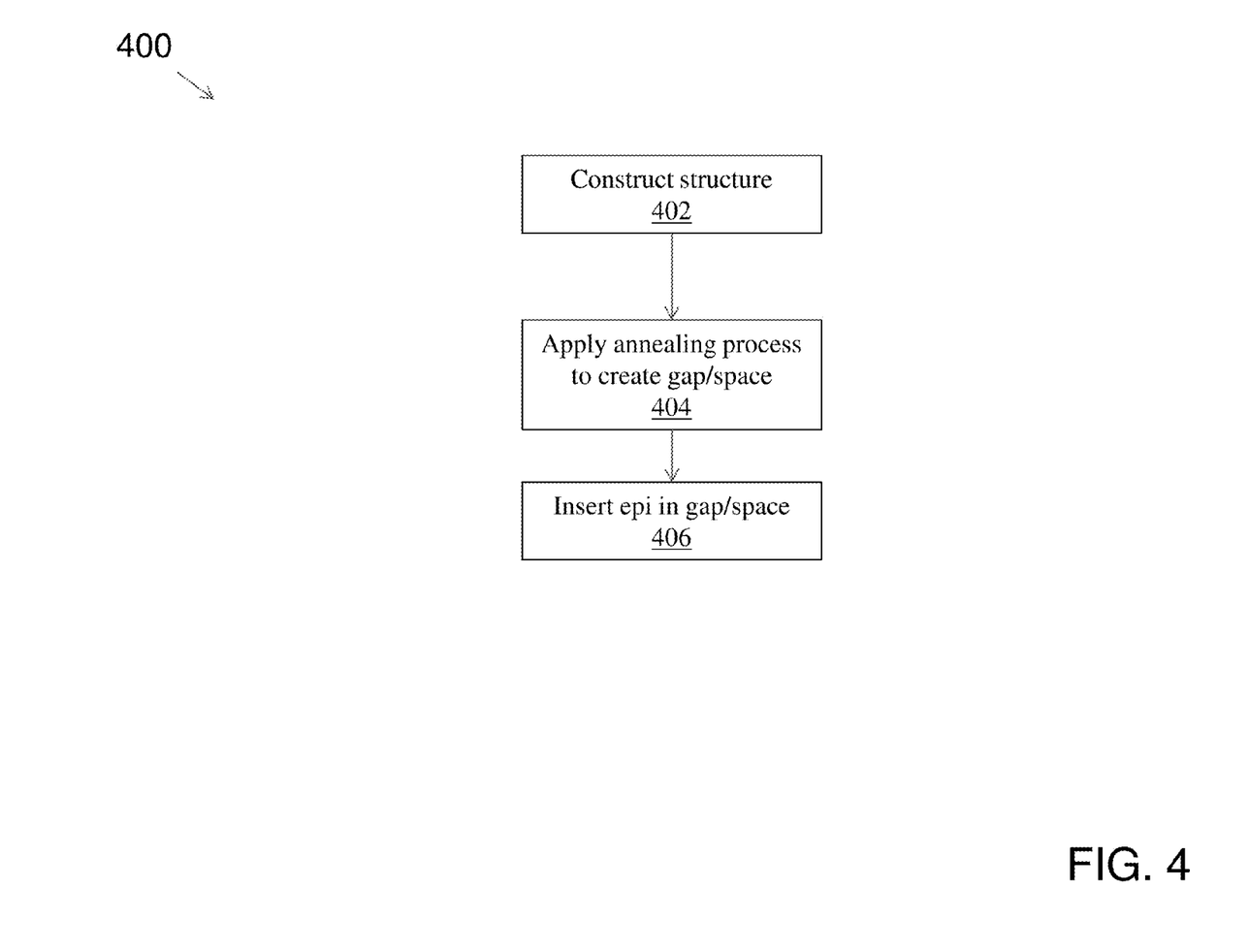
FIG. 4 is a flow chart of an exemplary method in accordance with one or more embodiments.

Turning now to FIG. 4, a flow chart of an exemplary method 400 in accordance with one or more embodiments is shown. The method 400 may be used to provide a controlled process for doping a FinFET structure while minimizing the movement, changes to, or damage to the fins.

In block 402, a FinFET structure may be constructed. For example, the FinFET structure constructed in block 402 may generally correspond to the structure 100 as shown in FIGS. 1A-1C.

In block 404, an annealing process may be applied to the structure constructed in block 402. The annealing process may result in a space or gap being created in the structure. For example, a space or gap may be created between one or more fins (e.g., fins 102) and a spacer (e.g., spacer 104) as shown in FIGS. 2A-2C.

In block 406, epi may be grown or inserted in the gap/space created in block 404. In this manner, dopants may be delivered more efficiently relative to conventional solutions, and a proper extension overlap and a suppressed extension junction gradient may be obtained.

The method 400 is illustrative. In some embodiments, one or more of the blocks (or portions thereof) may be optional. In some embodiments, one or more blocks or operations not shown may be included. In some embodiments, the blocks or operations may execute in an order or sequence different from what is shown in FIG. 4.

Embodiments of the disclosure may be used to form an extension (e.g., an epi-extension) close to a gate edge (underneath an offset spacer). One or more processes may be self-aligned in that hydrogen ($H_2$) diffusion may be limited by a geometry near a spacer to prevent a gate short to a source-drain region.

The illustrative examples described herein included references to various elements, materials, and compounds. One skilled in the art would appreciate that other elements, materials, and compounds may be substituted for those that were specifically referenced herein.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method for fabricating a semiconductor device comprising:
    forming a structure comprising a plurality of fins, which are disposed in parallel with each other to define respective channel regions, a single gate disposed over the respective channel regions of each of the plurality of fins, and a spacer,
    the spacer being disposed around and over the single gate and around and over respective outwardly facing sidewalls and respective upwardly facing surfaces of respective portions of each of the plurality of fins proximate to the single gate;
    applying an annealing process to the structure to shrink each of the plurality of fins in:
    side-to-side directions defined along a longitudinal axis of the single gate to create respective gaps between the respective outwardly facing sidewalls of each of the plurality of fins and complementary inwardly facing sidewalls of the spacer, and
    a vertical direction to create respective gaps between the respective upwardly facing surfaces of each of the plurality of fins and complementary downwardly facing surfaces of the spacer; and
    growing an epitaxial semiconductor layer in the respective gaps between the spacer and each of the plurality of fins.

2. The method of claim 1, wherein at least one of the plurality of fins comprises silicon.

3. The method of claim 1, wherein the spacer insulates the single gate from a source-drain region of the structure.

4. The method of claim 1, wherein at least one of the plurality of fins and the spacer are formed on a buried oxide (box) layer that is part of a silicon, oxide, silicon stack-up.

5. The method of claim 1, wherein the annealing process is a hydrogen annealing process.

6. The method of claim 5, wherein the annealing process is applied at approximately: seven-hundred fifty degrees Celsius and ten torr for five minutes.

7. A method for fabricating a semiconductor device comprising:
- forming a multi-gate structure comprising a plurality of fins, a single gate and a spacer,
- each one of the plurality of fins having a source region, an active region and a channel region and being disposed in parallel with others of the plurality of fins,
- the single gate being disposed over the channel region of each of the plurality of fins, and
- the spacer being arranged along a sidewall of the single gate and over respective portions of the plurality of fins proximate to the single gate;
- applying an annealing process to the structure to shrink each of the plurality of fins in side-to-side directions defined along a longitudinal axis of the single gate and in a vertical direction to thereby create respective gaps between the respective portions of each of the plurality of fins and the spacer; and
- growing an epitaxial semiconductor layer in the respective gaps between the spacer and the respective portions of each of the plurality of fins.

8. The method according to claim 7, wherein the respective gaps comprise:
- parallel and coplanar horizontal gaps running along respective upper surfaces of each of the plurality of fins; and
- parallel and coplanar vertical gaps running along respective sidewalls of each of the plurality of fins.

* * * * *